US011955347B2

(12) United States Patent
Kuah et al.

(10) Patent No.: US 11,955,347 B2
(45) Date of Patent: Apr. 9, 2024

(54) ENCAPSULATION PROCESS FOR DOUBLE-SIDED COOLED PACKAGES

(71) Applicant: ASMPT SINGAPORE PTE. LTD., Singapore (SG)

(72) Inventors: Teng Hock Kuah, Singapore (SG); Yi Lin, Singapore (SG); Ravindra Raghavendra, Singapore (SG); Kar Weng Yan, Singapore (SG); Angelito Barrozo Perez, Singapore (SG)

(73) Assignee: ASMPT SINGAPORE PTE. LTD., Singapore (SG)

( * ) Notice: Subject to any disclaimer, the term of this patent is extended or adjusted under 35 U.S.C. 154(b) by 230 days.

(21) Appl. No.: 17/540,322

(22) Filed: Dec. 2, 2021

(65) Prior Publication Data

US 2023/0178382 A1   Jun. 8, 2023

(51) Int. Cl.
  *H01L 21/56* (2006.01)
  *H01L 23/433* (2006.01)

(52) U.S. Cl.
  CPC ........ *H01L 21/565* (2013.01); *H01L 23/4334* (2013.01)

(58) Field of Classification Search
  CPC ............. H01L 23/38–46; H01L 23/367; H01L 23/4334; H01L 23/49568; H01L 21/565; H01L 21/4882; H01L 21/67126
  See application file for complete search history.

(56) References Cited

U.S. PATENT DOCUMENTS

| 2004/0089928 A1* | 5/2004 | Nakajima | H01L 24/32 257/E23.044 |
| 2005/0070051 A1* | 3/2005 | Nagahama | H01L 21/565 438/126 |
| 2010/0013120 A1* | 1/2010 | Ho | B29C 45/561 264/272.11 |

(Continued)

FOREIGN PATENT DOCUMENTS

| JP | 2013-089607 A | 5/2013 |
| JP | 2013089607 A * | 5/2013 |

(Continued)

OTHER PUBLICATIONS

European Search Report dated May 17, 2023, issued in corresponding European Patent Application No. 22210187.5.

*Primary Examiner* — Walter H Swanson
*Assistant Examiner* — Jacob T Nelson
(74) *Attorney, Agent, or Firm* — OSTROLENK FABER LLP (57) ABSTRACT

One or more electronic devices that are mounted on a substrate, including at least one cooling plate in contact with the one or more electronic devices, are encapsulated. The substrate is clamped between a first mold half and a second mold half which define a molding cavity for molding the one or more electronic devices. A cavity insert movably located in the first mold half is projected into the cavity in order to contact and apply a sealing pressure onto the at least one cooling plate. After introducing a molding compound into the cavity at a first fill pressure, the molding compound in (Continued)

the cavity is packed by applying a second fill pressure which is higher than the first fill pressure. During this time, the sealing pressure is maintained at values that are higher than the first fill pressure and the second fill pressure.

16 Claims, 5 Drawing Sheets

(56) References Cited

U.S. PATENT DOCUMENTS

2018/0254198 A1* 9/2018 Maeda .................... B29C 45/34

FOREIGN PATENT DOCUMENTS

| JP | 2016-035975 A | | 3/2016 | |
|----|----|----|----|----|
| JP | 2016035975 A | * | 3/2016 | |
| KR | 20200025094 A | * | 3/2020 | |
| WO | WO-2015159743 A1 | * | 10/2015 | ........... H01L 21/565 |

* cited by examiner

ENCAPSULATION PROCESS FOR DOUBLE-SIDED COOLED PACKAGES

FIELD OF THE INVENTION

The invention relates to the encapsulation of electronic devices, and in particular, to the encapsulation of electronic packages which promote cooling on both sides of the electronic packages.

BACKGROUND AND PRIOR ART

The hybrid and electrical vehicle market is currently buoyant, leading to exciting growth seen in the automotive industry. As a result, a wider spectrum of vehicles are being electrified, such that demand for the production of power semiconductor modules used in inverters is increasing. Double-Sided Cooled packages, commonly called "DSC", offer improvements in performance through higher power density, scalability and space advantages.

A DSC package may include a direct bonded copper (DBC) isolating ceramic substrate, which is made from aluminum oxide. It is used as a large metal spacer that provides mechanical support and better heat dissipation from electronic components such as insulated-gate bipolar transistors ("IGBTs") and diodes. One such DSC package known in the art has a blocking voltage capability of 750V and a continuous collector current of 800 A. The maximum continuous junction temperature of the DSC package may be in the order of 175° C. This is possible due to the fact that the DSC package does not have a traditional silicone gel-filled design, but uses a hard epoxy molding compound and it contains no wire bonds. Cooling heatsinks, such as the DBC substrates, are located on both sides of such a DSC package. These dual-sided heat sinks are constructed with a Pin Fin structure on top and bottom sides of the DSC package, which greatly improves the thermal performance of the DSC package. The DSC packages are a cost-effective solution, as better thermal performance can be achieved with less silicon content.

DSC packages have to be molded using different encapsulation processes. Conventionally, an over-molding process is a common encapsulation approach for DSC packages in the market. Using this approach, a bottom cooling plate is exposed during molding, but molding compound is made to cover a top cooling plate of the DSC package. However, this approach requires additional grinding and polishing processes in order to expose the top cooling plate after the said over-molding.

Figure 1:
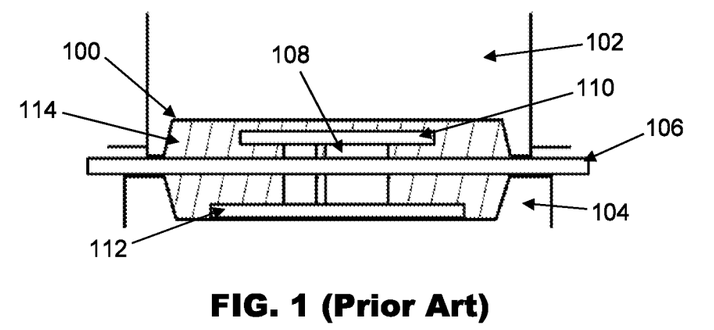
FIG. 1 is a cross-sectional view of a conventional molded DSC package.

FIG. 1 is a cross-sectional view of a conventional molded DSC package 100. The molded DSC package 100 has been encapsulated with a molding compound using a molding system comprising a top die 102 and a bottom die 104. The top die 102 and bottom die 104 cooperate to clamp a substrate 106 so that electronic devices 108 mounted on the substrate 106 are located within cavities formed in the top die 102 and bottom die 104. On top and bottom surfaces of the electronic devices 108 are a top cooling plate 110 and a bottom cooling plate 112 respectively. Each cooling plate 110, 112 may comprise a DBC isolating ceramic substrate.

Molding compound 114 is introduced into the cavities of the top die 102 and bottom die 104 in order to encapsulate the electronic devices 108 and top and bottom cooling plates 110, 112. While FIG. 1 shows that the bottom cooling plate 112 is relatively flush with a cavity surface of the bottom die 104, a gap is present between the top cooling plate 110 and a cavity surface of the top die 102, such that excess molding compound 114 is introduced between the top cooling plate 110 and the cavity surface of the top die 102. In order to ensure the effectiveness of the top cooling plate 110 to conduct heat away from the molded DSC package 100, such excess molding compound 114 molded onto a top surface of the top cooling plate 110 should be removed.

Figure 2:
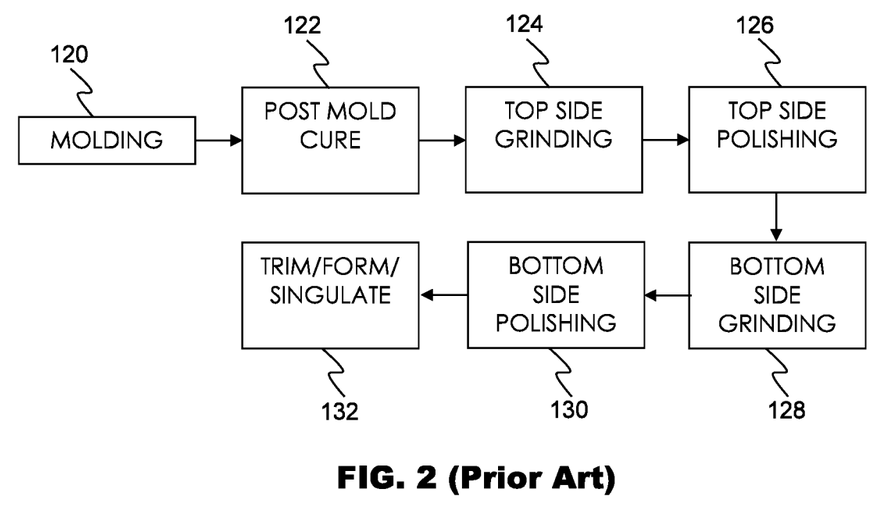
FIG. 2 is a flowchart illustrating a conventional process flow for manufacturing a DSC package.

FIG. 2 is a flowchart illustrating a conventional process flow for manufacturing a DSC package. A molding process 120 is first conducted to encapsulate the electronic devices 108 on the substrate 106. Post mold cure 122 is subsequently conducted to ensure that the molding compound 114 has sufficiently set and hardened. In order to remove excess molding compound 114 from the top surface of the top cooling plate 110, top side grinding 124 is performed on the molded DSC package 100, and top side polishing 126 should next be performed to enhance the surface quality of the molded DSC package 100.

Where excess molding compound 114 also exists on a bottom surface of the bottom cooling plate 112, bottom side grinding 128 and bottom side polishing 130 would also be necessary. In order to complete the packaging process, each molded DSC package 100 located on a substrate 106 which includes a plurality of molded DSC packages 100 would have to be separated by way of trimming, forming or singulating 132 each of the said molded DSC packages 100.

A number of shortcomings have been encountered from the aforesaid over-molding approach. Excessive mold flash is typically present after over-molding, leading to an elevated risk of reliability failures due to cracks propagating in the molded DSC package. The additional processing as described above results in a longer production cycle time and higher costs, such as production, manpower and equipment costs. Moreover, the package thickness is prone to being out of range of an acceptable specification, requiring additional resources for reworking it. Hence, yield rates are reduced due to more instances of quality rejection.

It would be beneficial to provide an encapsulation process for DSC packages that avoids at least some of the aforesaid disadvantages of the prior art.

SUMMARY OF THE INVENTION

It is thus an object of the present invention to seek to provide an encapsulation process which ensures robust mold flash control during an encapsulation process to avoid the risk of defects in a DSC package, and to simplify the process flow by removing the need for subsequent grinding and polishing after the encapsulation process.

According to a first aspect of the invention, there is provided a method for encapsulating one or more electronic devices mounted on a substrate, including at least one cooling plate in contact with the one or more electronic devices, the method comprising the steps of: placing the substrate between a first mold half and a second mold half, the first and second mold halves defining a molding cavity for molding the one or more electronic devices; clamping the substrate between the first and second mold halves; projecting a cavity insert which is movably located in the first mold half into the cavity in order to contact and apply a sealing pressure onto the at least one cooling plate; introducing a molding compound into the cavity at a first fill pressure; and thereafter packing the molding compound in the cavity by applying a second fill pressure which is higher than the first fill pressure; wherein the sealing pressure is maintained at values that are higher than the first fill pressure and the second fill pressure while introducing and packing the molding compound respectively.

According to a second aspect of the invention, there is provided a method of manufacturing an electronic package which includes one or more electronic devices mounted on a substrate, including at least one cooling plate in contact with the one or more electronic devices, the method comprising the steps of: placing the substrate between a first mold half and a second mold half, the first and second mold halves defining a molding cavity for molding the one or more electronic devices; clamping the substrate between the first and second mold halves; projecting a cavity insert which is movably located in the first mold half into the cavity in order to contact and apply a sealing pressure onto the at least one cooling plate; encapsulating the one or more electronic devices by introducing a molding compound into the cavity at a first fill pressure; and thereafter packing the molding compound in the cavity by applying a second fill pressure which is higher than the first fill pressure; wherein the sealing pressure is maintained at values that are higher than the first fill pressure and the second fill pressure while introducing and packing the molding compound respectively.

It would be convenient hereinafter to describe the invention in greater detail by reference to the accompanying drawings which illustrate preferred embodiments of the invention. The particularity of the drawings and the related description is not to be understood as superseding the generality of the broad identification of the invention as defined by the claims.

BRIEF DESCRIPTION OF THE DRAWINGS

Examples of an encapsulation process in accordance with the invention will now be described with reference to the accompanying drawings, in which.

DETAILED DESCRIPTION OF THE PREFERRED EMBODIMENTS

Figure 3:
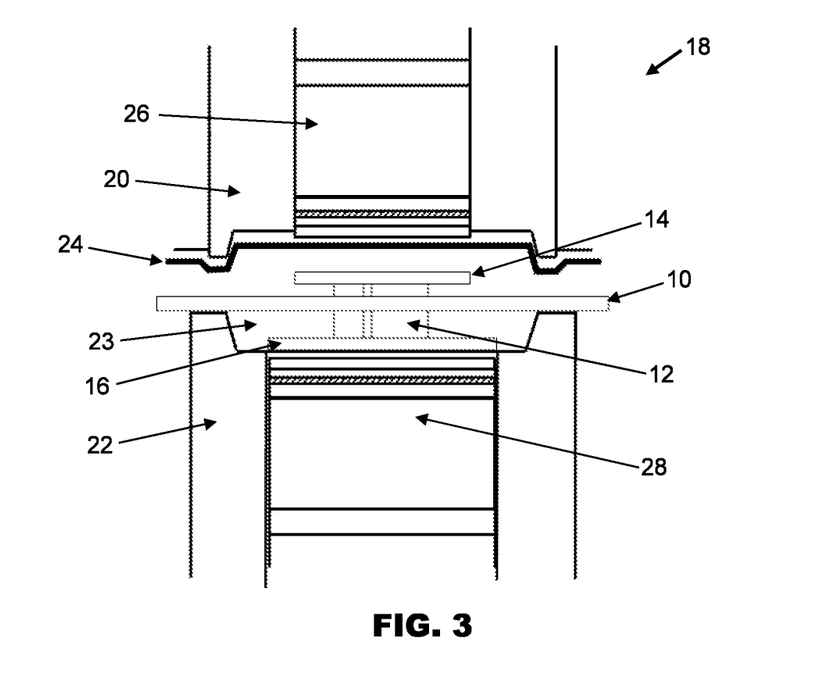
FIG. 3 is a cross-sectional view of a molding apparatus for encapsulating a DSC package according to the preferred embodiment of the invention, wherein the molding apparatus is in an open position.

FIG. 3 is a cross-sectional view of a molding apparatus 18 for encapsulating a DSC package according to the preferred embodiment of the invention, wherein the molding apparatus is in an open position. The DSC package comprises a substrate 10, one or more electronic devices 12 that are mounted on the substrate 10, a first or top cooling plate 14 positioned over and in contact with the electronic devices 12 mounted on a top surface of the substrate 10 and a second or bottom cooling plate 16 positioned underneath and in contact with the electronic devices 12 mounted on a bottom surface of the substrate 10.

The substrate 10, including the electronic devices 12 and top and bottom cooling plates 14, 16, is located in the molding apparatus 18 which has a top mold half or top die 20 and a bottom mold half or bottom die 22. The top and bottom dies 20, 22 define a molding cavity 23 for encapsulating the electronic devices 12. A first cavity insert, such as top cavity insert 26, is centrally-positioned and movably located in the top die 20 for applying a biasing or sealing force on the top cooling plate 14. Also, a second cavity insert, such as bottom cavity insert 28, is centrally-positioned and movably located in the bottom die 22 for correspondingly applying a biasing or sealing force onto the bottom cooling plate 16. A pliant protective film 24 separating the top die 20 and the top cooling plate 14 is also illustrated. A similar pliant protecting film may also separate the bottom die 22 and the bottom cooling plate 16.

Figure 4:
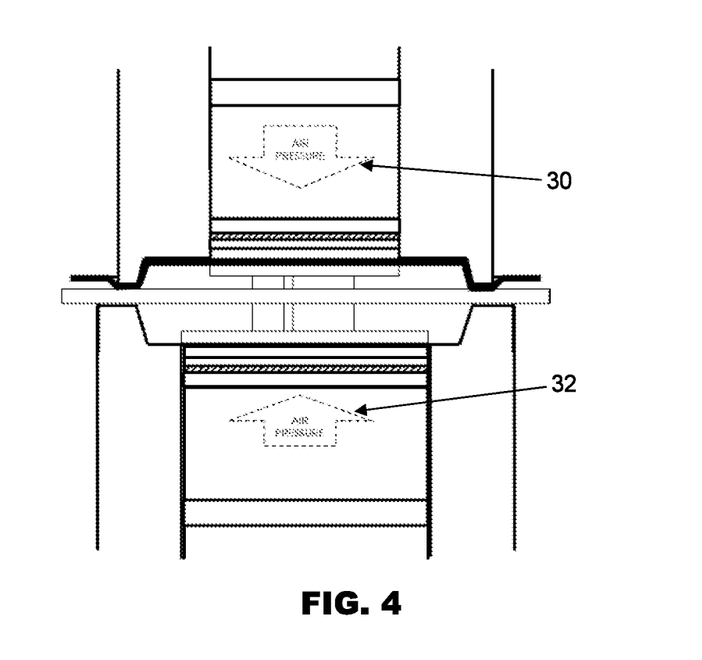
FIG. 4 is a cross-sectional view of the molding apparatus of FIG. 3, wherein the molding apparatus is in a closed position.

FIG. 4 is a cross-sectional view of the molding apparatus 18 of FIG. 3, wherein the molding apparatus 18 is in a closed position. In this position, the substrate 10 is clamped between the top and bottom dies 20, 22. The top cavity insert 26 is projected into the molding cavity in order to contact and apply a top biasing force 30 onto the top cooling plate 14 so that a gap between the top cavity insert 26 and the top cooling plate 14 is closed. Where the pliant protective film 24 is used to separate the top die 20 and the top cooling plate 14, the protective film 24 is operative to contact the top cooling plate 14 to form a sealing arrangement around a top surface of the top cooling plate 14 when the top biasing force 30 is applied by the top cavity insert 26.

Correspondingly, the bottom cavity insert 28 is projected into the molding cavity 23 in order to contact and apply a bottom biasing pressure or biasing force 32 onto the bottom cooling plate 16 in order to close a gap between the bottom cooling plate 16 and the bottom die 22. The bottom cavity insert 28 similarly applies a sealing pressure onto the bottom cooling plate 16. Therefore, a molding compound would also not be able to flow into an interface between the bottom cooling plate 16 and the bottom die 22.

While the top and bottom cavity inserts 26, 28 are applying top and bottom biasing forces 30, 32 respectively onto the top and bottom cooling plates 14, 16, molding compound is introduced into the spaces or voids around the electronic devices 12 as formed by the molding cavity 23 created by the top and bottom dies 20, 22. The top biasing force 30 is generated from an air pressure acting on the top cavity insert 26 (see FIG. 6), and the bottom biasing force 32 is generated from an air pressure that may be similarly acting on the bottom cavity insert 28. Accordingly, although the voids around the electronic devices 12 are filled with molding compound, a top surface of the top cooling plate 14 and a bottom surface of the bottom cooling plate 16 are not covered with molding compound, thereby ensuring that outer surfaces of the top and bottom cooling plates 14, 16 are not covered with the molding compound, which may impede heat dissipation of the molded DSC package. Furthermore, no additional steps of grinding and polishing the top and bottom sides of the molded DCS package are required, leading to cost savings.

Figure 5:
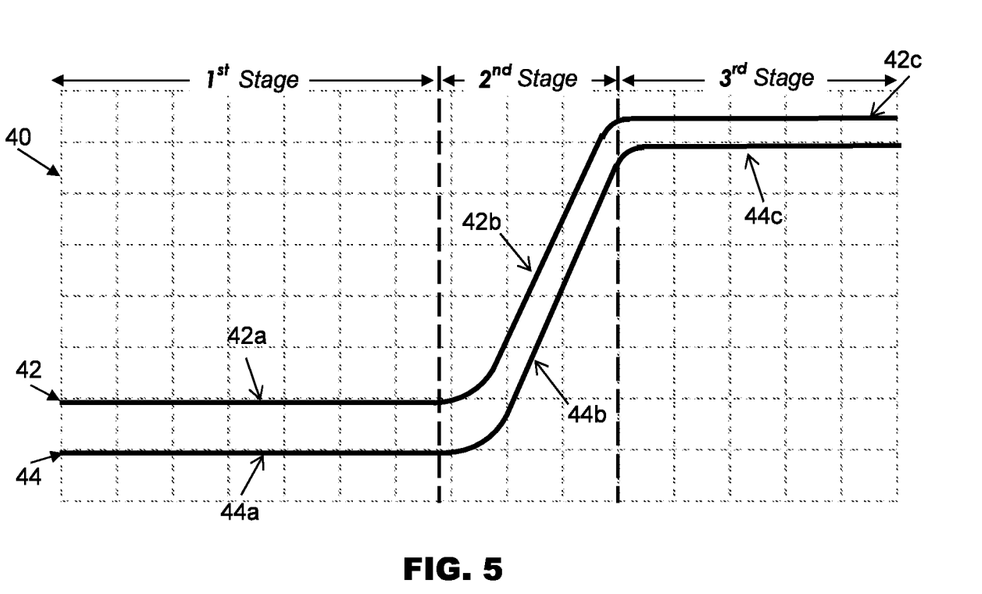
FIG. 5 is a graph of pressure over time during different stages of an encapsulation process according to the preferred embodiment of the invention.

FIG. 5 is a graph of pressure over time during different stages of an encapsulation process according to the preferred embodiment of the invention. The pressure-time graph 40 is divided into three stages, namely a $1^{st}$ Stage when molding compound is first introduced into the molding apparatus 18, a $2^{nd}$ Stage when a packing pressure is applied on the molding compound to ensure that molding compound totally fills the space within the molding cavity, and a $3^{rd}$ Stage when the molding compound is allowed to cure under heat and pressure to finally produce the molded DSC package. Two lines are drawn on the pressure-time graph 40 denoting a sealing pressure, which correlates to an air pressure 42, and a fill pressure 44 respectively being simultaneously exerted in the molding apparatus 18.

During the $1^{st}$ Stage of the encapsulation process when the molding compound is introduced into the molding cavity 23, a first fill pressure 44a is applied to the molding compound when introducing it into the molding cavity, and the first fill pressure 44a may be maintained at a substantially constant value. At this stage, a first air pressure 42a is set to be maintained at a value that is slightly higher than the first fill pressure 44a. In FIG. 5, the first air pressure 42a is set at a fixed increment to the first fill pressure 44a, so that the first air pressure 42a is also maintained at a substantially constant first constant value. However, the first air pressure 42a may also vary relative to the first fill pressure 44a, as long as the first air pressure 42a is consistently maintained at a higher value than the first fill pressure 44a.

At the commencement of the $2^{nd}$ Stage, the molding cavity has been filled and a higher packing pressure has to be applied to the molding compound. Hence, a second fill pressure 44b is steadily increased to apply a greater pressure to the molding compound so as to fill all the spaces or voids within the molding cavity 23. Whilst the second fill pressure 44b is being steadily increased, a second air pressure 42b should also be correspondingly steadily increased so that the second air pressure 42b is at all times higher than the second fill pressure 44b. It should be appreciated that the difference between the second air pressure 42b and the second fill pressure 44b need not remain constant and may vary. Hence, the difference between the second air pressure 42b and the second fill pressure 44b may start to narrow, as shown in FIG. 5. As shown in the illustration, the first sealing or air pressure 42a is less than the second sealing or air pressure 42b.

Once the fill pressure 44 reaches a pre-determined maximum value, a maximum third fill pressure 44c is maintained at the $3^{rd}$ Stage of the process when the molding compound is allowed to cure. At the same time, heat is applied so that the molding compound will cure and harden. During the $3^{rd}$ Stage, the system continues to ensure that a third air pressure 42c that is exerted on the cooling plate 14, 16 is greater than the third fill pressure 44. This difference may vary or remain constant in the course of the $3^{rd}$ Stage. As illustrated in FIG. 5, the difference between the third air pressure 42 and the third fill pressure 44 may be maintained at a second constant value throughout the $3^{rd}$ Stage, wherein the second constant value is higher than the first constant value. After the molding compound has cured, encapsulation of the DSC package is completed and the molding apparatus 18 can be opened to remove the molded DSC package.

Figure 6:
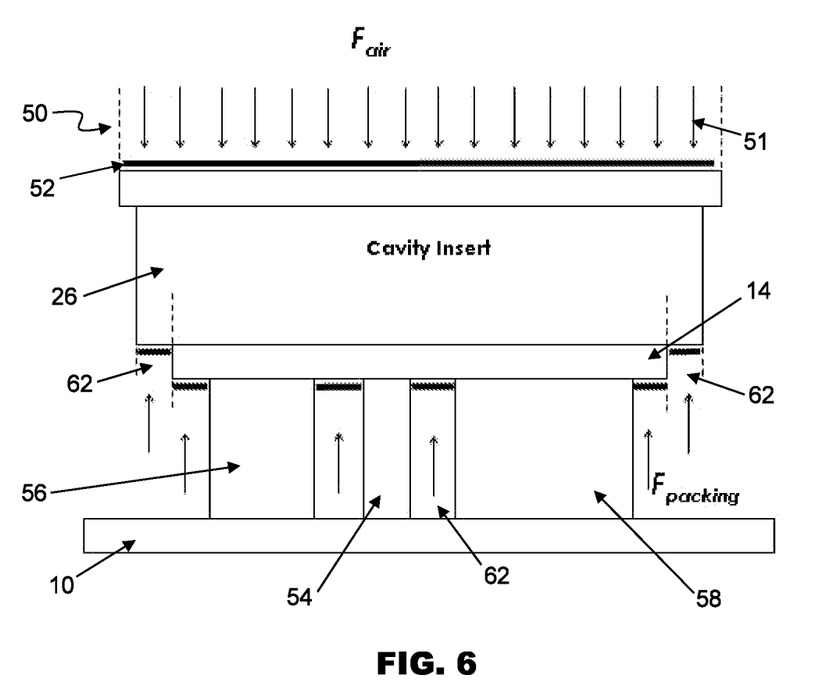
FIG. 6 is a side view of a top cavity insert applying a biasing force onto a top cooling plate during molding.

FIG. 6 is a side view of a top cavity insert 26 applying a biasing force on a top cooling plate 14, such as a DBC substrate, during molding. It can be seen that a diaphragm 52 separates the top cavity insert 26 from an air pressure chamber 50, wherein the air pressure chamber 50 contains a gas for exerting a downwards air pressure 51 onto the diaphragm 52 and therefore onto the top cavity insert 26 to apply the top biasing force 30 onto the top cooling plate 14.

Although not shown in the drawings, it would be appreciated that the bottom cavity insert 28 should also include a diaphragm located between the bottom cavity insert 28 and a bottom air pressure chamber, wherein the bottom air pressure chamber similarly contains a gas for exerting an upwards air pressure onto the diaphragm and the bottom cavity insert 28.

The top cavity insert 26 directly contacts the top cooling plate 14, which in turn contacts electronic devices such as a diode die 56 and a transistor die 58 that are resting on a substrate 10. There may further be a support pillar 54 functioning as a spacer between the top cooling plate 14 and the substrate 10.

Figure 7:
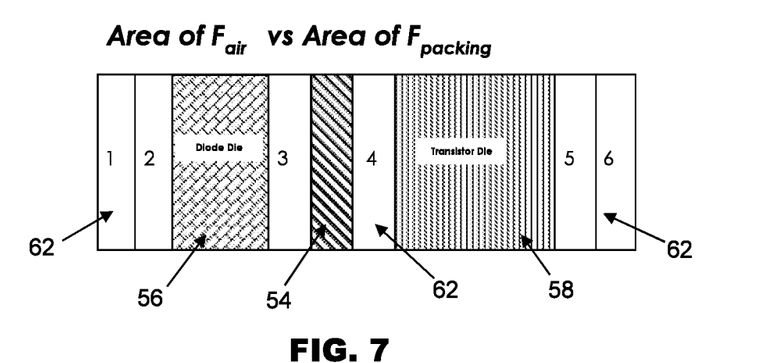
FIG. 7 is a plan view of areas where an air pressure and a packing pressure are exerted on a top cooling plate.

FIG. 7 is a plan view of areas where an air pressure and a packing pressure are exerted on a DBC device. It would be appreciated that the sealing or air pressure 42 is exerted on areas where a biasing force is applied by the top cooling plate 14, such as the support pillar 54, diode die 56 and transistor die 58. On the other hand, there are voids 62 that are filled with molding compound, and these are areas where packing pressure in the form of an elevated fill pressure 44 will be exerted on the molding compound in order to totally fill the voids 62.

Figure 8:
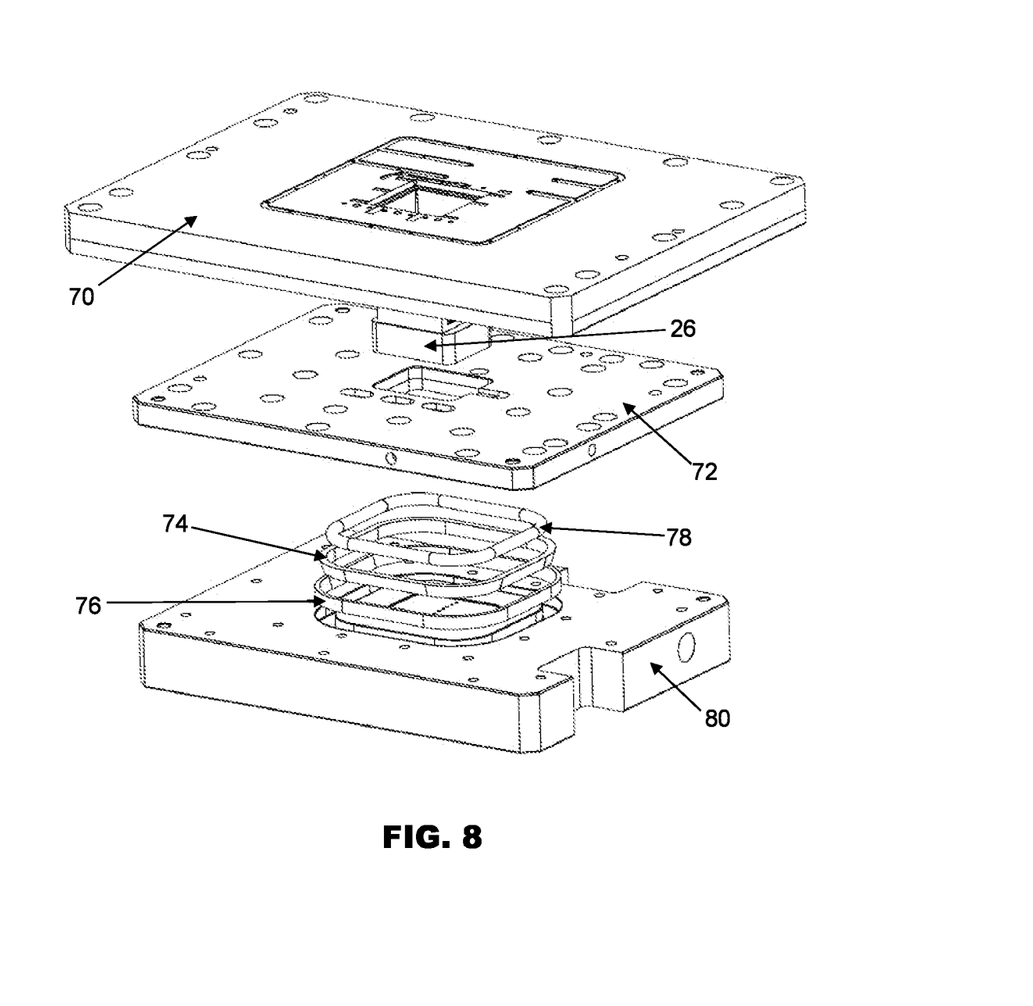
FIG. 8 is an exploded view of a sealing mechanism used in the molding apparatus according to the preferred embodiment of the invention.

FIG. 8 is an exploded view of a sealing mechanism used in the molding apparatus according to the preferred embodiment of the invention. The top cavity insert 26 is arranged on a cavity block 70, and the top cavity insert 26 is insertable into a through-hole formed in a cavity back plate 72. A resilient seal, which may be in the form of an O-ring 78 or a silicon seal, surrounds the top cavity insert 26 and is positioned to rest against an inner wedge ring 74 that surrounds the O-ring 78, the inner wedge ring 74 having an inclined face. The inner wedge ring 74 is slidable relative to an inclined face of an outer wedge ring 76, wherein the outer wedge ring surrounds the inner wedge ring 74. The inner wedge ring 74 and outer wedge ring 76 cooperate to enhance a sealing effect of the O-ring 78. The O-ring 78, inner wedge ring 74 and outer wedge ring 76 are housed within a groove of an airbag block 80.

Figure 9:
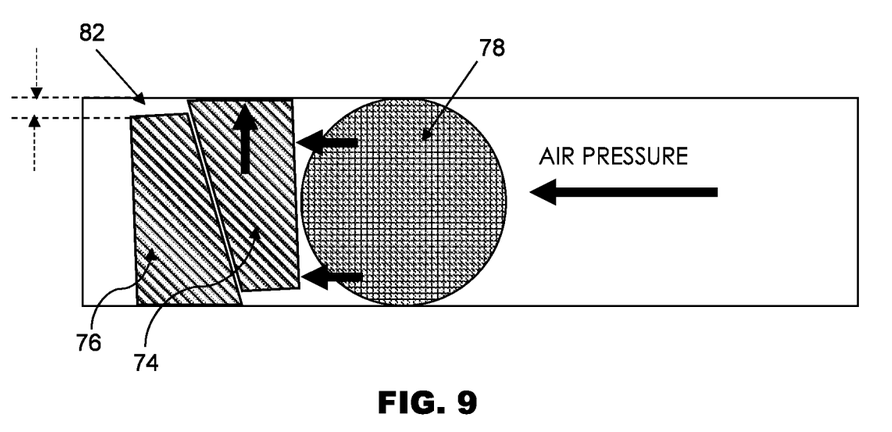
FIG. 9 is a side view of the sealing mechanism when air pressure is applied to the top cavity insert.

FIG. 9 is a side view of the sealing mechanism when an air pressure is applied to the top cavity insert 26. When an air pressure is exerted on the top cavity insert 26, a high air pressure emanating from a direction of the top cavity insert 26 pushes the O-ring 78 towards and against the inner wedge ring 74. The inclined face of the inner wedge ring 74 will slide against the opposing inclined face of the outer wedge ring 76, when the high air pressure pushes the O-ring 78 to abut against the inner wedge ring 74.

Figure 10:
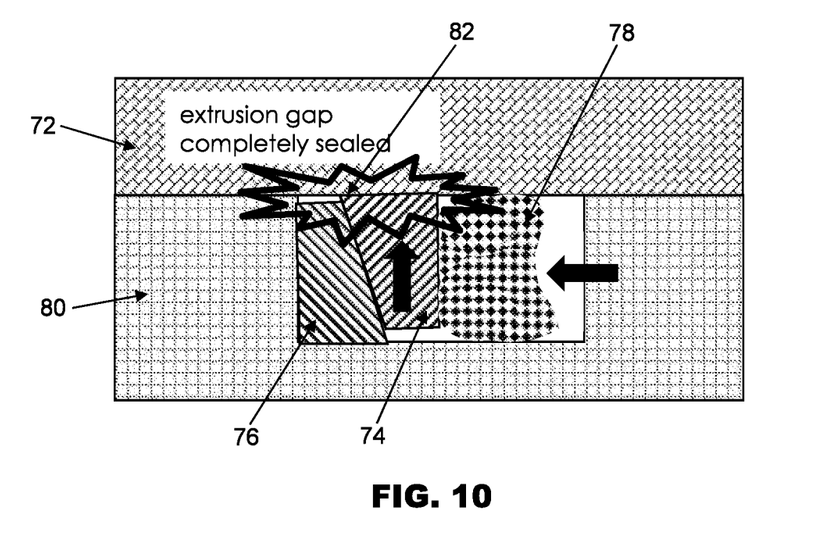
FIG. 10 is a side view of an extrusion gap being sealed by the sealing mechanism of FIG. 8.

FIG. 10 is a side view of an extrusion gap being sealed by the sealing mechanism of FIG. 8. As the inner wedge ring 74 slides upwards relative to the outer wedge ring 76, a top portion of the inner wedge ring 74 closes an extrusion gap 82 that is present between the inner wedge ring 76 and the cavity back plate 72 (and therefore between the O-ring 78 and an external environment) to completely seal the extrusion gap 82. This sealing effect prevents gas leakage to the external environment through the extrusion gap 82, and ensures that the air pressure 42 is not reduced by unwanted gas leakage.

It should be appreciated that the encapsulation process flow for DSC packages as described above applies multiple stages of pre-determined air pressure 42 and molding compound fill pressure 44 at pre-determined points of a mold cavity filling process to ensure balance between the mold flow and the movement of a movable cavity insert mechanism. The said process will help to maintain robust mold flash control and eliminate the risk of cracks propagating in the DSC package. Furthermore, the process flow is simplified since there is no need for further grinding and polishing processes after encapsulation of the DSC package.

The invention described herein is susceptible to variations, modifications and/or additions other than those specifically described and it is to be understood that the invention includes all such variations, modifications and/or additions which fall within the spirit and scope of the above description.

The invention claimed is:

1. Method for encapsulating one or more electronic devices mounted on a substrate, including at least one cooling plate in contact with the one or more electronic devices, the method comprising the steps of:
    placing the substrate between a first mold half and a second mold half, the first and second mold halves defining a molding cavity for molding the one or more electronic devices;
    clamping the substrate between the first and second mold halves;
    projecting a cavity insert which is movably located in the first mold half into the cavity in order to contact and apply a sealing pressure onto the at least one cooling plate;
    introducing a molding compound into the cavity at a first fill pressure; and thereafter packing the molding compound in the cavity by applying a second fill pressure which is higher than the first fill pressure;
    wherein the sealing pressure is maintained at values that are higher than the first fill pressure and the second fill pressure while introducing and packing the molding compound respectively.

2. The method as claimed in claim 1, wherein: a first cooling plate is located on a first side of the substrate and a second cooling plate is located on a second side of the substrate opposite to the first side; and a first cavity insert is movably located in the first mold half and a second cavity insert is movably located in the second mold half; and the method comprises the step of projecting the first and second cavity inserts into the cavity in order to apply sealing pressures onto the first and second cooling plates respectively.

3. The method as claimed in claim 1, including a pliant protecting film separating the first mold half and the at least one cooling plate, wherein the pliant protecting film is operative to contact the cooling plate for forming a sealing arrangement on a surface of the at least one cooling plate when the cavity insert applies a sealing pressure on it.

4. The method as claimed in claim 1, including the steps of exerting a first sealing pressure when introducing the molding compound into the cavity, and exerting a second sealing pressure when packing the molding compound in the cavity, wherein the first sealing pressure is less than the second sealing pressure.

5. The method as claimed in claim 4, further comprising the step of steadily increasing the second fill pressure when packing the molding compound in the cavity, while steadily increasing the sealing pressure to maintain the sealing pressure at a higher value than the second fill pressure at all times.

6. The method as claimed in claim 4, further comprising the step of allowing the molding compound to cure while it is being heated at a third fill pressure after packing the molding compound, while maintaining a third sealing pressure which is higher than the third fill pressure on the at least one cooling plate.

7. The method as claimed in claim 6, wherein the first sealing pressure is maintained at a first constant value when introducing the molding compound into the cavity and the third sealing pressure is maintained at a second constant value when the molding compound is allowed to cure, wherein the second constant value is higher than the first constant value.

8. The method as claimed in claim 1, wherein the step of applying the sealing pressure further comprises the step of generating an air pressure onto the cavity insert, such that the cavity insert contacts and applies the sealing pressure onto the at least one cooling plate.

9. The method as claimed in claim 8, wherein the air pressure is maintained at values that are higher than the first fill pressure and the second fill pressure while introducing and packing the molding compound respectively.

10. The method as claimed in claim 8, wherein the air pressure is generated by an air pressure chamber exerting an air pressure onto a diaphragm separating the cavity insert and the air pressure chamber.

11. The method as claimed in claim 8, wherein the cavity insert is arranged on a cavity block, and the cavity insert is insertable into a through-hole formed in a cavity back plate.

12. The method as claimed in claim 11, including a resilient seal surrounding the cavity insert, the seal being positioned to rest against an inner wedge ring having an inclined face that surrounds the resilient seal, wherein the inner wedge ring is slidable with respect to an inclined face of an outer wedge ring which surrounds the inner wedge ring.

13. The method as claimed in claim 12, wherein the seal, inner wedge ring and outer wedge ring are housed within a groove of an airbag block.

14. The method as claimed in claim 12, wherein when the air pressure is applied to the cavity insert, the resilient seal is pushed by the air pressure against the inner wedge ring, such that the inclined face of the inner wedge ring slides against the inclined face of the outer wedge ring.

15. The method as claimed in claim 14, wherein the sliding of the inner wedge ring relative to the outer wedge ring closes an extrusion gap that is present between the resilient seal and an external environment, to prevent gas leakage to the external environment through the extrusion gap.

16. A method of manufacturing an electronic package which includes one or more electronic devices mounted on a substrate, including at least one cooling plate in contact with the one or more electronic devices, the method comprising the steps of:
    placing the substrate between a first mold half and a second mold half, the first and second mold halves defining a molding cavity for molding the one or more electronic devices;
    clamping the substrate between the first and second mold halves;
    projecting a cavity insert which is movably located in the first mold half into the cavity in order to contact and apply a sealing pressure onto the at least one cooling plate;
    encapsulating the one or more electronic devices by introducing a molding compound into the cavity at a first fill pressure; and thereafter
    packing the molding compound in the cavity by applying a second fill pressure which is higher than the first fill pressure;

wherein the sealing pressure is maintained at values that are higher than the first fill pressure and the second fill pressure while introducing and packing the molding compound respectively.

* * * * *